May 24, 1966 W. G. PFANN 3,252,321
PIEZORESISTIVE MATERIAL
Filed Aug. 21, 1961
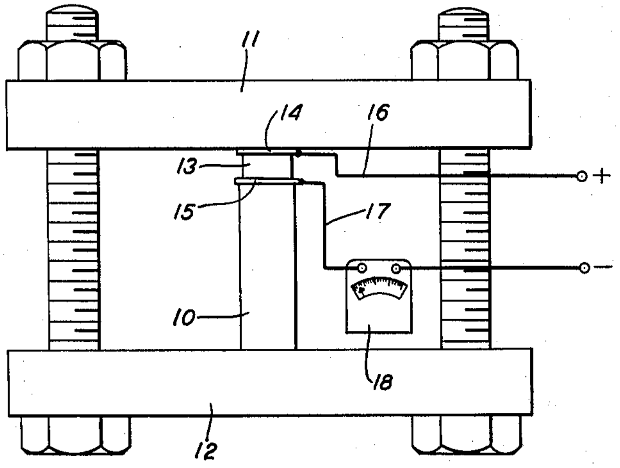
INVENTOR
W. G. PFANN
BY [signature]
ATTORNEY United States Patent Office 3,252,321

Patented May 24, 1966

3,252,321
PIEZORESISTIVE MATERIAL

William G. Pfann, Far Hills, N.J., assignor to Bell Telephone Laboratories, Incorporated, New York, N.Y., a corporation of New York Filed Aug. 21, 1961, Ser. No. 132,859
6 Claims. (Cl. 73—88.5)

This invention relates to a novel piezoresistive material which provides useful and unexpected piezoresistive response. This material is particularly useful for stress measuring and detecting devices.

Conventional prior art piezoresistive semiconductors are single crystal bodies which exhibit anisotropic piezoresistive effects and are thus utilized according to a prescribed crystallographic orientation chosen to provide a high piezoresistive coefficient. Devices employing these conventional materials must therefore be crystallographically oriented in a precise manner to obtain the desired response. Since polycrystalline bodies of these materials are irregularly oriented it is recognized in the art that polycrystalline materials generally provide poor or useless piezoresistive characteristics.

A semiconductor material has now been found which exhibits essentially isotropic piezoresistivity. With this new piezoresistive material the crystal orientation may be completely disregarded and any crystal cut may be used with equal advantage. Furthermore, polycrystalline bodies of this material are as effective as single crystal bodies and both provide a significant isotropic piezoresistive response.

The inventive piezoresistive material of this invention is the n-type semiconductor alloy 13–19% silicon, balance germanium.

The preferred piezoresistive composition for this invention is approximately 16.6 atomic percent Si-83.4 atomic percent Ge. This composition provides exceptional isotropy and possesses the following piezoresistive coefficients:

$$\pi_{1111} \equiv \pi_{11} = -50 \times 10^{-12} \text{ dynes/cm.}^2$$
$$\pi_{1122} \equiv \pi_{12} = +23 \times 10^{-12} \text{ dynes/cm.}^2$$
$$\pi_{1212} \equiv \pi_{44} = -67 \times 10^{-12} \text{ dynes/cm.}^2$$

However, departures may be made in either direction from this optimum composition while still obtaining the advantages of this invention. For instance, with the composition 19% silicon-81% germanium, or the composition 13% silicon-81% germanium, over 50% of the isotropy is still retained. At 18% silicon-82% germanium, or 15% silicon-85% germanium, over 60% of the isotropy is preserved. Thus, this invention is intended to encompass piezoresistive compositions of 13–19% silicon—balance germanium and preferably 15–18% silicon—balance germanium. The percentages are atomic percentages.

In theory any composition exhibiting n-type resistivity will be useful for the purposes of this invention. However, for consistent and predictable response it is desirable to have a resistivity value which insures an n-type conduction mechanism.

Accordingly, the preferred range of resistivities is 0.005 ohm-cm. to 20 ohm-cm.

Alloy compositions within these ranges may be made by any appropriate prior art technique. One particular method adapted for preparing these compositions is described in detail in United States Patent No. 2,829,994 issued April 8, 1958.

The compositions of this invention are particularly well suited for use in semiconductor load cells or strain gages. A particular embodiment of such a load cell is shown in the drawing in which:

The figure is a perspective view of a piezoresistive semiconductor load cell adapted for the utilization of the novel piezoresistive material which forms an essential feature of this invention.

The figure shows a body 10 under compressive stress from loading members 11 and 12. To measure the magnitude of the stress in body 10 or the rate of relaxation of this body under an applied stress, a gage 13 is interposed between the test body and the load. The gage according to this invention is composed of the semiconductor alloy composition prescribed above. Bounding each major plane of the gage body are metal contacts 14 and 15 with leads 16 and 17 attached to accommodate the piezoresistive measurement. The resistance variation is indicated or recorded on galvanometer 18.

A load cell consisting of a crystal having the composition 16.6% Si-83.4% Ge and approximate dimensions of 1 cm. x 1 cm. x 0.1 cm. used in accordance with the illustrated embodiment exhibits essentially the same piezoresistive response for all crystal cuts. Specifically an n-type alloy having this preferred composition and a resistivity of approximately 10 ohm-cm. will show a variation in resistance measured parallel to the strain which is represented by:

$$\frac{\Delta\rho}{\rho} = \sigma(-50 \times 10^{-12})$$

where $\sigma$ is the stress magnitude in dynes/cm.$^2$, $\rho$ is the zero strain resistance and $\Delta\rho$ is the resistance change. This relationship is valid for any crystal orientation chosen.

For a similar piezoresistive device comprising a typical prior art piezoresistive material, for instance p-type silicon, the variation of piezoresistive response for two particular strain directions can be appreciated from these relationships:

$$\text{for p-Si [111]: } \frac{\Delta\rho}{\rho} = (+92.0 \times 10^{-12})\sigma$$

$$\text{for p-Si [100]: } \frac{\Delta\rho}{\rho} = (+6.6 \times 10^{-12})\sigma$$

In other words, merely varying the crystal cut from [100] to [111] results in a variation in piezoresistive response by a factor of 14 to 1. Since this is an angular deviation of only 54° it can be appreciated that the crystal cut of ordinary piezoresistive semiconductors is highly critical. Whereas the above embodiment discusses a single crystal alloy composition it will be clear to those skilled in the art that since this composition possesses no piezoresistive anisotropy a polycrystalline body will serve the identical piezoresistive function and will exhibit coefficients of the same magnitude.

Various other modifications of this invention will become apparent to those skilled in the art. All such deviations which basically rely on the principles through which this disclosures has advanced the art are properly considered within the scope of this invention.

What is claimed is:

1. A piezoresistive element for use in semiconductor load cells or strain gauges comprising an n-type semiconductor material having the composition:
13%–19% silicon
balance germanium, said material exhibiting essentially isotropic piezoresistivity.

2. The element of claim 1 wherein the resisitivity of the semiconductor material is in the range 0.005 to 20 ohm-cm.

3. The element of claim 1 having the composition:
15 atomic percent–18 atomic percent silicon
balance germanium.

4. The element of claim 1 having the composition:
16.6% silicon
83.4% germanium.

5. A piezoresistive stress gage comprising an n-type semiconductor body having the composition:

13 atomic percent–19 atomic percent silicon balance germanium, said body exhibiting essentially isotropic piezoresisitivity, and electrical means associated with said body for measuring piezoresisitive variations in the body.

6. The gage of claim 5 wherein the composition of the body is approximately 16.6% silicon–83.4% germanium.

References Cited by the Examiner

UNITED STATES PATENTS 3,049,685 8/1962 Wright ------------- 73—88.5

OTHER REFERENCES

Levatis, Alfred: "Electrical Properties of Germanium-Silicon Alloys," Physical Review, vol. 99, No. 6, Sept. 15, 1955, p. 1810 to 1814.

Johnson, E. R., and Christian, J. M.: "Some Properties of Germanium-Silicon Alloys," Physical Review, vol. 95, No. 2, July 15, 1954, p. 560–561.

RICHARD C. QUEISSER, *Primary Examiner.*

ERNEST F. KARLSEN, CHARLES A. RUEHL, *Assistant Examiners.*